US009784782B2

(12) United States Patent
Friedl et al.

(10) Patent No.: US 9,784,782 B2
(45) Date of Patent: Oct. 10, 2017

(54) VACUUM CHAMBER MACHINE WITH SPRING FRACTURE DETECTION

(71) Applicant: Multivac Sepp Haggenmüller GmbH & Co. KG, Wolfertschwenden (DE)

(72) Inventors: Jonas Friedl, Peiting (DE); Konrad Mößnang, Kempten (DE)

(73) Assignee: MULTIVAC SEPP HAGGENMUELLER SE & CO. KG, Wolfertschwenden (DE)

(*) Notice: Subject to any disclaimer, the term of this patent is extended or adjusted under 35 U.S.C. 154(b) by 44 days.

(21) Appl. No.: 14/593,995

(22) Filed: Jan. 9, 2015

(65) Prior Publication Data

US 2015/0198649 A1      Jul. 16, 2015

(30) Foreign Application Priority Data

Jan. 14, 2014   (EP) .................... 14151132

(51) Int. Cl.

| | |
|---|---|
| *B65B 31/00* | (2006.01) |
| *B65B 31/02* | (2006.01) |
| *G01R 31/02* | (2006.01) |
| *B65B 57/18* | (2006.01) |
| *E05F 15/60* | (2015.01) |
| *A47B 81/00* | (2006.01) |
| *E05F 13/00* | (2006.01) |
| *F16F 1/02* | (2006.01) |

(52) U.S. Cl.
CPC ............ *G01R 31/024* (2013.01); *A47B 81/00* (2013.01); *B65B 31/02* (2013.01); *B65B 57/18* (2013.01); *E05F 13/00* (2013.01); *E05F 15/60* (2015.01); *F16F 1/021* (2013.01)

(58) Field of Classification Search
CPC ........ G01R 31/024; E05F 15/60; E05F 13/00; F16F 1/021; B65B 57/18; B65B 31/02; A47B 81/00
USPC ...................................... 324/537; 53/86, 432
See application file for complete search history.

(56) References Cited

U.S. PATENT DOCUMENTS

| | | | | |
|---|---|---|---|---|
| 3,832,507 A | * | 8/1974 | Marquardt | ............. B60R 21/01 200/254 |
| 5,056,292 A | * | 10/1991 | Natterer | ................. B29C 65/18 53/373.4 |
| 5,384,531 A | * | 1/1995 | Yamazaki | .......... G01R 31/2851 324/73.1 |
| 5,465,557 A | | 11/1995 | Harte | |
| 2003/0042921 A1 | * | 3/2003 | Hollman | ............ G01R 1/07392 324/750.14 |

FOREIGN PATENT DOCUMENTS

| | | |
|---|---|---|
| CN | 202783871 U | 3/2013 |
| DE | 19850613 A1 | 5/2000 |
| EP | 0945347 A1 | 9/1999 |
| EP | 1403185 A1 | 3/2004 |

* cited by examiner

*Primary Examiner* — Farhana Hoque
(74) *Attorney, Agent, or Firm* — Husch Blackwell LLP

(57) ABSTRACT

The invention relates to a vacuum chamber packaging machine with spring fracture detection. A first electrical line can be provided connecting springs to a controller, where interruption of the line due to a fractured spring may be detected by the controller via an applied voltage, so that no safety deficiency arises.

18 Claims, 3 Drawing Sheets

VACUUM CHAMBER MACHINE WITH SPRING FRACTURE DETECTION

CROSS-REFERENCE TO RELATED APPLICATIONS

This application claims priority to European Patent Application Number 14151132.9 filed Jan. 14, 2014, to Jonas Friedl and Konrad Mößnang, currently pending, the entire disclosure of which is incorporated herein by reference.

FIELD OF THE INVENTION

The invention relates to a packaging machine in the form of a vacuum chamber machine and to a method for determining a spring fracture in a vacuum chamber machine.

BACKGROUND OF THE INVENTION

A vacuum chamber machine is known from CN 202783871 U disclosing the manual opening and closing of a chamber lid, where a spring is provided for weight relief for the chamber lid. If the tension spring fractures, then the operator would only notice this when opening the chamber lid.

Vacuum chamber machines marketed by the Applicant under the name C700 are known in the market as having a motor-driven chamber lid pivot motion. Tension springs are provided for weight relief for the chamber lid because such chamber machines can, due to their sometimes very large dimensions, have a chamber lid with a weight of up to 200 kg. Such motor-driven chamber lids are provided with a protective frame which is configured to perform a relative motion during closing motion towards the chamber lid when, for example, a body part of the operator is located within the chamber machine in the region of the chamber lid. The relative movement of the protective frame relative to the chamber lid is detected by sensors and the controller stops the motorized chamber lid drive, thereby preventing injury. In this, the chamber lid must come to a standstill within the protective frame. For this purpose, it is necessary to deplete the kinetic energy of the mass of the chamber lid about a pivot point of the chamber lid within a respective rotational angle. For this, several tension springs are provided to support the motorized chamber lid drive or to provide a weight counterbalance. Should during operation a spring fracture occur, this can hardly be detected by the operator because the chamber lid usually still automatically opens and closes again. In case of danger, in which the protective frame triggers, the chamber lid is less supported and the chamber lid can no longer be brought to a standstill by the motor in time to prevent injury.

SUMMARY OF THE INVENTION

The object of the present invention is to improve a vacuum chamber machine with a power-driven chamber lid pivot movement in terms of its safety.

The vacuum chamber machine according to one embodiment of the present invention comprises a frame, a controller and a chamber lid, and where the chamber lid is pivotable by a power-operated drive, and where a plurality of springs are provided to operatively support the drive. The vacuum chamber machine may be characterized in that each of the springs is as part of a separate or, in the event of a plurality of springs, a common electric circuit connected to the controller in such a manner that a spring fracture is detectable by a change in the current or the voltage. With this test, the safety of the packaging machine can be increased, because otherwise with conventional vacuum chamber machines with a motorized drive for pivoting the chamber lid, fracture of a single spring could not be detected. If a protective frame is provided at the chamber lid, then reliable interruption of the chamber lid movement in case of danger would otherwise no longer be guaranteed despite the protective frame.

The springs can be attached to spring holders in an electrically insulated manner, in order to be able to implement and evaluate the springs as part of the first electrical line in a simple design configuration.

The spring holders may themselves be arranged in the vacuum chamber machine as being electrically insulated from the frame and the springs.

In one embodiment, one, several, or all spring holders are electrically connected in series to each other and to the controller with a second electric circuit in order to be able to detect an insulation fault of at least one spring on a spring holder, because one or more faulty isolations on the springs can cause the spring fracture detection failing to recognize this despite a spring being fractured.

The springs can be made of metal, such as stainless steel, so as to have a sufficient spring coefficient and an electrical conductivity as high as possible.

It is favorable if a section of the spring as long as possible is used as part of the electric circuit. For example, the entire length of the spring could be used for this, or at least the section of the spring between two spring holders, since this is the area in which a spring fracture could compromise the safety of the packaging machine.

It is conceivable that each spring is connected to the controller as part of a separate electric circuit. However, it can be more efficient under certain circumstances, if a plurality of springs, or even all the springs, are connected to the controller as part of an electric common electric circuit. It is also conceivable that respective groups of a plurality of springs are connected to the controller via a separate electric circuit.

If a plurality of springs are connected to the controller via a common electric circuit, then it can be advantageous for the measuring operation to have these springs be electrically connected in series. The reason is that in this case, the current flow would be interrupted in the entire electric circuit when already a single spring suffers spring fracture that could compromise the safety of the packaging machine.

The controller may be configured to turn off the drive when recognizing a spring fracture or to not allow a closing movement of the chamber lid and/or to output error information to a display of the controller, so that the operator can rectify the problem and safety is again restored.

One embodiment of the drive comprises at least one of a spindle motor, a servo motor, or a linear motor.

The drive can in an advantageous manner be activated via a foot switch and/or the controller to improve operation of the vacuum chamber machine.

The chamber lid in one embodiment comprises a protective frame to detect a body part such as an arm in the region of the protective frame when closing the chamber lid in order to initiate an emergency stop and interrupt the lid movement.

The method according to one embodiment of the present invention for determining spring fracture in a vacuum chamber machine provides a plurality of springs to support a power-operated drive for pivoting a chamber lid. Each of the springs is, via a first electric circuit, connected to a controller, and the electric circuit is connected to a first output terminal and to a first input terminal of the controller. The method can comprise the steps of:

applying an electrical voltage to the first output terminal,
testing whether a voltage is applied to the first input terminal or whether there is a current flow, and
enabling the drive for the chamber lid via the controller when there is a predetermined voltage present or the current at the first output terminal is equal to that of the first input terminal.

Safety of the vacuum chamber machine for humans and the machine in terms of the power-operated pivot drive can be increased in a structurally simple manner and with little effort on the part of the controller.

In one embodiment, the method comprises the following steps for testing the insulation of the springs relative to the spring holders, where the spring holders are, via a second electrical line, connected in series, and the second line is connected to a second output terminal and a second input terminal of the controller:

applying an electrical voltage to the first output terminal,
testing whether there is a voltage or whether there is a current flow at the first input terminal and at the second input terminal,
enabling the drive if no spring fracture and no defective insulation of a spring is detected by the controller, and
outputting error information to a display of the controller in the event that a spring fracture or a defective insulation of a spring was detected by the controller, while the drive is not enabled.

The state "no spring fracture and no defective insulation" can be either detected in that a current measurement process at the first input terminal measures the same current as at the first output terminal, or that there is a voltage at the first input terminal which, when compared to the voltage at the first output terminal, is reduced by the voltage drop at the springs. A spring fracture can be detected when there is a voltage at the first input terminal that is different than the voltage expected as described above, or in that no current flow is measured at the first input terminal. A defective insulation of a spring can be detected in that a current flow is detected at the second input terminal. It is conceivable that this finding is respectively established by comparison to a predetermined threshold value.

Spring fracture detection is thereby improved via the first electric circuit in that even a defective insulation, though necessary for spring fracture detection, at the springs is detected and the safety of the overall system is further improved.

The electric voltage at the first output terminal may be between 20V and 35V, for example, 24V.

The drive can be effected by a motorized drive, such as a spindle motor, a servo motor or a linear motor.

In one embodiment, the drive is activated via a foot switch and/or the controller to improve operation of the vacuum chamber machine, in particular for closing the chamber lid.

Other and further objects of the invention, together with the features of novelty appurtenant thereto, will appear in the course of the following description.

DESCRIPTION OF THE SEVERAL VIEWS OF THE DRAWING

In the following, an advantageous embodiment of the invention is further illustrated using a drawing. Specifically.

Same components are throughout the figures designated with the same reference numerals.

DETAILED DESCRIPTION OF THE INVENTION

Figure 1:
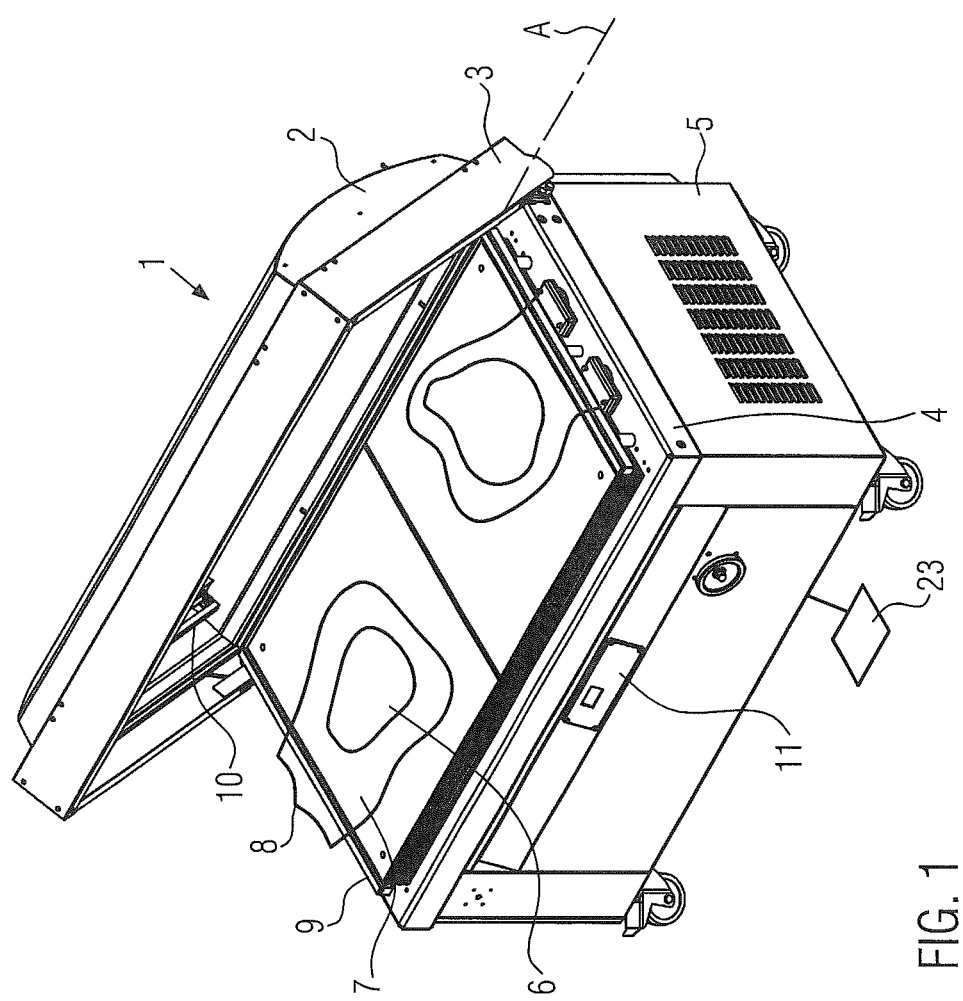
FIG. 1 is a side perspective view of a vacuum chamber machine according to one embodiment of the present invention, illustrating the chamber lid in an open position.

The invention will now be described with reference to the drawing figures, in which like reference numerals refer to like parts throughout. For purposes of clarity in illustrating the characteristics of the present invention, proportional relationships of the elements have not necessarily been maintained in the drawing figures.

The following detailed description of the invention references specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The present invention is defined by the appended claims and the description is, therefore, not to be taken in a limiting sense and shall not limit the scope of equivalents to which such claims are entitled.

FIG. 1 shows a vacuum chamber machine 1 with an opened chamber lid 2 comprising a protective frame 3. The chamber lid 2 is pivoted about an axis A, in the closed state forming a vacuum chamber with a lower chamber part 4 which is arranged on a frame 5. When the chamber lid 2 is open, bags 7 filled with a product 6 can be inserted such that a bag neck 8 to be sealed rests on a sealing bar 9. When the chamber lid 2 is closed, a sealing bar 10 attached in the chamber lid 2 after evacuation of the bag neck 8 presses against the sealing bars 9 and creates a gas-tight seal of the bag 7.

The protective frame 3 may be movably mounted at the chamber lid 2, and sensors—not shown in detail—detect a movement or a change in position with respect to a basic position. If, when closing or pivoting the chamber lid 2 downwardly, an arm or a hand of an operator or a part of the product 6 is located in the outer region of the chamber lid 2 and therefore within the region of the protective frame 3, then the protective frame 3 contacts this respective part. During the further movement or the closing of the chamber lid 2, the protective frame 3 may remain resting on the body part of the operator or on the product. The power-operated closing movement of the chamber lid 2 is still active, so that a relative movement between the protective frame 3 and the chamber lid 2 is given and the protective frame 3 is no longer located in its basic position and this is communicated by the sensors to the controller 11. A controller 11 can then interrupt the closing movement of the chamber lid 2 to prevent injury to the operator or damage to the product.

Figure 2:
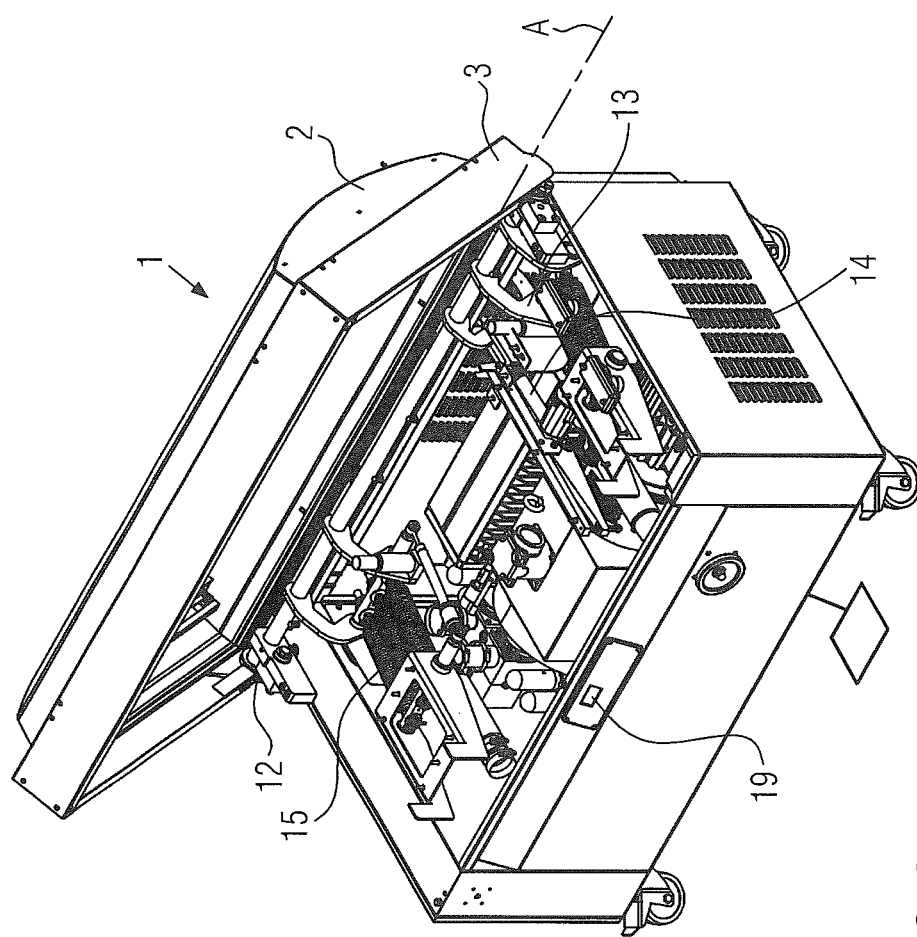
FIG. 2 is a side perspective view of the vacuum chamber machine of FIG. 1, illustrating an interior of the vacuum chamber machine being exposed.

FIG. 2 shows the power-operated drive of the chamber lid 2. The chamber lid 2 is connected to a shaft 12 and pivots about its axis A. Two pairs of levers 13 may be attached to the shaft 12. A motorized drive 14 can be connected to a lever 13 and via this lever 13 may cause the pivotal movement of the chamber lid 2 for opening and closing. The motorized drive 14 can be at least indirectly, for example via a power protection, connected to the controller 11, or the controller 11 may be configured to control the drive 14, respectively. For supporting the chamber lid movements or for relieving the motor power of the motorized drive 14, springs 15, in particular tension springs, can be provided that reduce the weight load of the chamber lid 2 on the motorized drive 14. The motorized drive 14 in this embodiment comprises a lifting spindle motor. However, alternative drives, for example, a pneumatic or motorized linear drive are also conceivable.

The springs 15 may be tension-loaded during the closing movement of the chamber lid 2. The springs 15 are mounted to spring holders 16 in an electrically insulated manner, where the spring holders 16 can be arranged either on the frame 5 or on the levers 13. The design and the number of springs 15 depend on the weight forces of the chamber lid 2 and also define the amount of required torque or the required power of the drive 14, respectively.

In the event of a spring fracture of one or more springs 15, the relief of weight forces for the chamber lid 2 decreases and the load at the motorized drive 14 increases. It is possible that the drive 14 can still open the chamber lid 2 since the power of the drive 14 is still sufficient. During the normal closing operation, however, the operator cannot recognize a fractured spring. Only in an emergency stop situation by triggering the protective frame 3 is the drive 14 possibly not able to stop the chamber lid 2 in time, as the forces of the chamber lid 2 on the drive 14 are too great. The remaining travel distance of the chamber lid 2 needed for the braking process during which the chamber lid 2 is still moving within the protective frame 3 can in this case be too long and injuries to the operator are no longer excluded. To increase safety, spring fracture detection is provided which is described in more detail with reference to FIG. 3.

Figure 3:
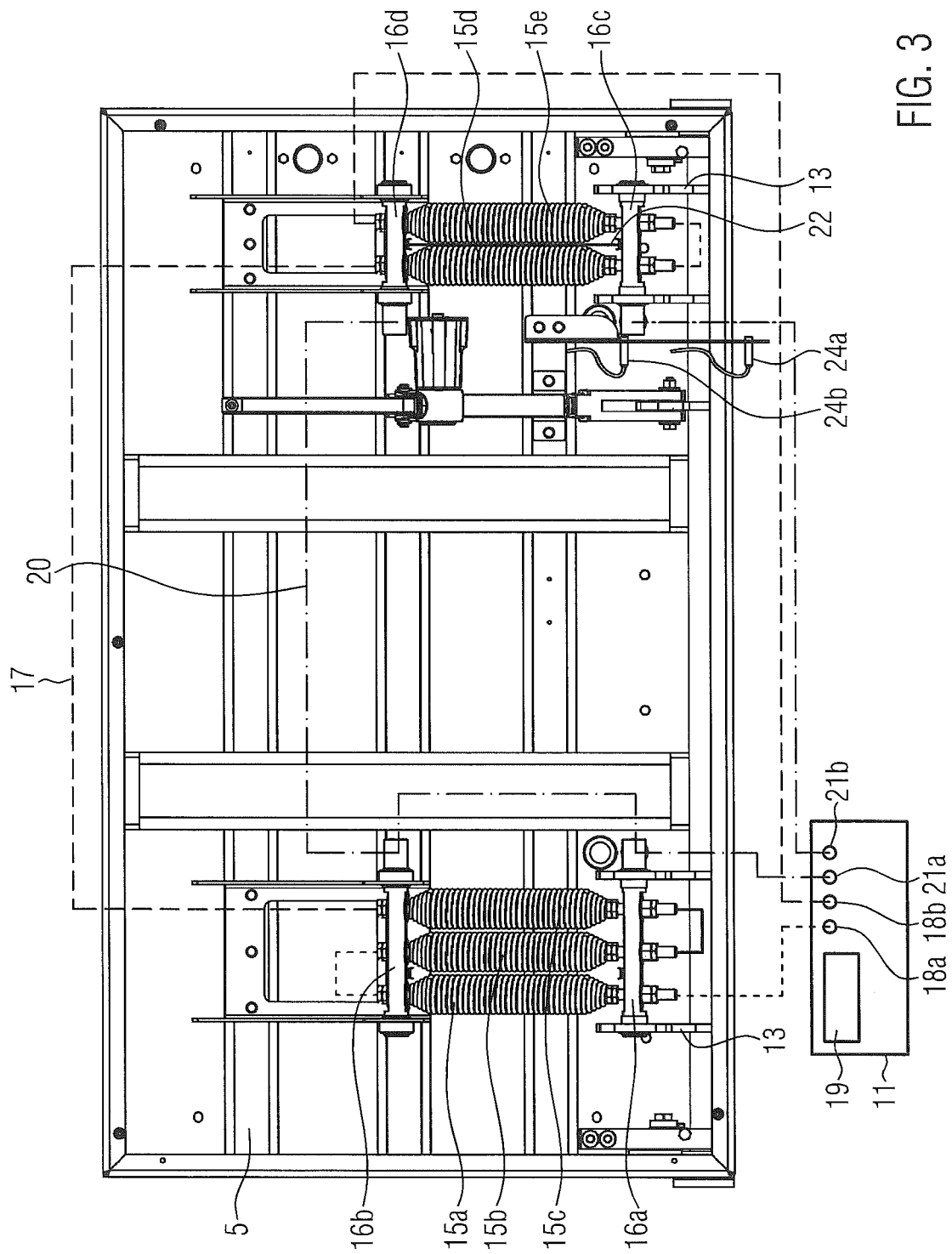
FIG. 3 is a bottom view of a spring assembly of a vacuum chamber machine according to one embodiment of the present invention.

FIG. 3 shows a view from below of the chamber lid adjustment. Three springs 15a, 15b, 15c are shown on the left side of FIG. 3 and two springs 15d and 15e on the right. The left springs 15a, 15b, 15c can be attached with their ends to two spring holders 16a and 16b, where the springs 15a, 15b, 15c in this case are electrically insulated from the spring holders 16a, 16b. For example, electric insulation can be effected by a plastic sleeve or any other conceivable electrically non-conductive sleeve or any non-conductive connecting element. Similarly, the springs 15d, 15e may be attached in an electrically insulated manner on the right side to further spring holders 16c, 16d. The spring holders 16a, 16c can likewise be attached in an electrically insulated manner on the levers 13. The springs 15 may transmit their tension force via the lever 13 onto the chamber lid 2. The spring holders 16a, 16c are, in one embodiment, electrically insulated from all components of the vacuum chamber machine 1. The further spring holders 16b, 16d can also be attached electrically insulated from the frame 5 so that all the spring holders 16a, 16b, 16c, 16d are electrically insulated from all parts of the vacuum chamber machine 1.

The five springs 15a to 15e may be connected via an electric circuit 17, shown in FIG. 3 as dashed lines, in series to the controller 11. Since all the springs 15a to 15e may be individually electrically-insulatedly attached in the vacuum chamber machine 1, they themselves represent part of the first electric circuit 17. Should a spring 15 be fractured, then no current can flow through the first electric circuit 17. The controller 11 may comprise a first output terminal 18a and a first input terminal 18b to which both ends of the electric circuit 17 are connected. The controller 11 can periodically, or prior to each start of the chamber lid movement, check the first electric circuit 17 to determine whether an electric voltage, such as 12 V or 24 V, is applied to the first output terminal 18a, and it is then tested at the first input terminal 18b to determine whether there is a voltage present that results when considering the ohmic resistance of the spring 15. If there is no voltage at the first input terminal 18b, the controller 11 can thereby determine whether at least one spring 15 is fractured. If this is the case, then the start of the chamber lid movement is not enabled and an appropriate error message or an error code is outputted to a display 19 of the controller 11. Alternatively or additionally, the current can be measured at the first output terminal 18a and at the first input terminal 18b. If these two currents match, then this is proof for the fact that no losses occur in the first electric circuit 17. The controller 11 can therefore conclude that an electric circuit 17 is not given. A spring fracture can be detected analogously when different first electric circuits 17 are respectively provided for one or more springs 15.

If, for example, several insulations between the springs 15a to 15c and spring holders 16a, 16b are defective, then the first electric circuit 17 could be closed although a spring 15 is fractured because the current can flow through a spring holder 16a, 16b. In this case, the voltage of the output terminal 18a could be present at the first input terminal 18b despite a fractured spring. In order to be able to rule out also this error case, a second electric circuit 20, shown as a dashed-dotted line in FIG. 3, is provided connecting the ends of the electrically insulated spring holders 16a to 16d in series. The second electric circuit 20 can be similar to the first electric circuit 17 and connected to the controller 11 via a second output terminal 21a and a second input terminal 21b. A first test of the second electric circuit 20 is performed with a voltage of 12V or 24V, for example, to the second output terminal 21a. As long as the second input terminal 21b has the voltage reduced by the expected voltage drop at the spring holders 16, then it can be ensured that no cable break is given in the second electric circuit 20 and that this electric circuit 20 is in order. A second test may be done during the spring fracture test. A voltage may be applied to the first output terminal 18a, and it is at the two input terminals 18b and 21b determined whether a voltage is present there. It can alternatively be determined by current measurements at the output and input terminals, whether the respective electric circuits 17, 20 are intact or interrupted and therefore defective.

The following variations at the input terminals may lead to the following results:

| Input 18b | Input 21b | Result |
| --- | --- | --- |
| voltage/same current as at output 18a | no voltage/no current flow | no spring fracture |
| voltage/same current as at output 18a | voltage/current flow present | insulation defective at least at one spring |
| no voltage/no current flow | no voltage/no current flow | spring fracture detected |
| no voltage/no current flow | voltage/current flow present | spring fracture detected and insulation defective at least at one spring |

It is thereby ensured that a line break, a spring fracture or a defective insulation can be determined by the controller 11 via the first 17 and the second electric circuit 20 and the two output terminals 18a, 21a as well as the two input terminals 18b, 21b.

Testing the second electric circuit 20 using the voltage at the second output terminal 21 can be done, for example, every time the vacuum chamber machine 1 is switched on, cyclically at an interval of 1 minute, or prior to every start of the chamber lid movement or prior to each spring 15 test.

Testing for spring fracture and defective insulation occurs simultaneously via the voltage at the first output terminal 18*a* and the two input terminals 18*b*, 21*b*, at least prior to each closing operation of the chamber lid 2 and preferably after each closing operation in the closed position.

To exclude the case that two adjacent springs 15 fracture between two successive test cycles, and thereafter contact each other where the spring fracture is as a result not detected, either an electrically non-conductive divider 22 or an adequate spacing of the springs 15 can be provided.

The chamber lid movement can be initiated via a foot switch 23 (shown in FIG. 1), which is connected to the controller 11, and/or be started directly via the controller 11 after the evacuation procedure.

The open position of the chamber lid 2 can be detected by a first sensor 24*a* and the closed position, in which the bags are sealed and evacuated 7, by a second sensor 24*b*, where both sensors 24*a*, 24*b* are connected to the controller 11.

In one embodiment, a vacuum chamber machine 1 is provided having no protective frame 3 or having an alternative system with sensors instead of the protective frame 3, for example, photoelectric barriers, for detecting parts of the body during the closing movement of the lid.

From the foregoing, it will be seen that this invention is one well adapted to attain all the ends and objects hereinabove set forth together with other advantages which are obvious and which are inherent to the structure. It will be understood that certain features and sub combinations are of utility and may be employed without reference to other features and sub combinations. This is contemplated by and is within the scope of the claims. Since many possible embodiments of the invention may be made without departing from the scope thereof, it is also to be understood that all matters herein set forth or shown in the accompanying drawings are to be interpreted as illustrative and not limiting.

The constructions and methods described above and illustrated in the drawings are presented by way of example only and are not intended to limit the concepts and principles of the present invention. Thus, there has been shown and described several embodiments of a novel invention. As is evident from the foregoing description, certain aspects of the present invention are not limited by the particular details of the examples illustrated herein, and it is therefore contemplated that other modifications and applications, or equivalents thereof, will occur to those skilled in the art. The terms "having" and "including" and similar terms as used in the foregoing specification are used in the sense of "optional" or "may include" and not as "required". Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. Vacuum chamber machine comprising:
    a frame;
    a controller;
    a chamber lid pivotable by a power-operated drive between an open position and a closed position, wherein said chamber lid and a lower chamber part form a vacuum chamber when said chamber lid in said closed position; and
    a plurality of springs operably connected to said chamber lid, said plurality of springs being in a tensioned state when said chamber lid is in said closed position, and said plurality of springs disposed to operatively support said drive when pivoting said chamber lid from said closed position to said open position, each of said springs being a conductive element and electrically connected to said controller as part of an electric circuit such that a fracture of a spring is detectable via at least one of a change of a current flowing in the electric circuit, or a voltage applied to the electric circuit.

2. Vacuum chamber machine according to claim 1, wherein each of said plurality of springs include a first end and a second end, and each said first end and said second end of said plurality of springs are attached to a corresponding pair of spring holders in an electrically insulated manner.

3. Vacuum chamber machine according to claim 2, wherein said pairs of spring holders are also electrically insulated from said frame.

4. Vacuum chamber machine according to claim 3, wherein said pairs of spring holders are electrically connected in series to each other and to said controller in a second electrical circuit to be able to detect an insulation fault of at least one of said plurality of springs at one of said spring holders.

5. Vacuum chamber machine according to claim 1, wherein an entire length of a spring between a first said spring holder and a second said spring holder is a portion of said electric circuit.

6. Vacuum chamber machine according to claim 1, wherein said plurality of said springs are part of a common electric circuit.

7. Vacuum chamber machine according to claim 1, wherein a plurality of said springs are connected to each other in series.

8. Vacuum chamber machine according to claim 1, wherein said controller is in electronic communication with said power-operated drive and disables said power-operated drive when said controller detects a spring fracture.

9. Vacuum chamber machine according to claim 1, wherein said controller prevents said power-operated drive from pivoting said chamber lid between an open position and said closed position when said controller detects a spring fracture.

10. Vacuum chamber machine according to claim 1, wherein said controller is configured to output error information to a display of said controller when a spring fracture is detected.

11. Vacuum chamber machine according to claim 1, wherein said power-operated drive comprises at least one of a servo motor, a spindle motor and a linear motor.

12. Vacuum chamber machine according to claim 1, wherein said power-operated drive is activated by at least one of a foot switch, or said controller.

13. Vacuum chamber machine according to claim 1, wherein said chamber lid comprises a protective frame moveable relative to said chamber lid.

14. A method for detecting a spring fracture in a vacuum chamber machine, said method comprising the steps of:
    providing a plurality of springs for operatively supporting a power-operated drive for pivoting a chamber lid, where each of said springs is electrically connected to a controller via a first electric circuit, and wherein said first electric circuit is connected to a first output terminal and to a first input terminal of said controller;

applying an electrical voltage to said first output ten final;

testing whether a voltage is present at said first input terminal;

enabling said drive for said chamber lid via said controller when there is a predetermined voltage present or when said voltage at said first input terminal is equal to that at said first output terminal;

connecting each of said plurality of springs to one of a plurality of spring holders in an electrically insulated manner;

electrically connecting said plurality of spring holders in series using a second electrical line, said second electrical line creating a second circuit between a second output terminal and a second input terminal;

applying one of said electrical voltage or a second electrical voltage to said first output terminal;

testing whether one of said electrical voltage or a second electrical voltage is present at said second input terminal;

determining that there is a condition of defective insulation between one of the plurality of springs and one of a plurality of spring holders if all or a portion of one of said electrical voltage or all or a portion of said second electrical voltage is present at said second input terminal;

enabling said drive by said controller if no said condition of defective insulation between one of the plurality of springs and one of a plurality of spring holders is detected by said controller; and outputting error information to a display of said controller and disabling said drive if one of the predetermined voltage is not present at said first input terminal, said voltage at said first input terminal is not equal to that at said first output terminal, or said condition of defective insulation between one of the plurality of springs and one of a plurality of spring holders is detected.

15. Method according to claim 14, wherein said electrical voltage applied at said first output terminal is between about 20V and about 35V.

16. Method according to claim 14, wherein said drive is controlled by at least one of a foot switch, or said controller.

17. A method for detecting a spring fracture in a vacuum chamber machine, said method comprising the steps of:
providing a plurality of springs to provide a spring force for assisting a power-operated drive in pivoting a chamber lid from a closed position to an open position;

creating a first electric circuit between a first output terminal of a controller and a first input terminal of said controller, wherein each of said springs is a conductive component of said first circuit;

applying an electrical voltage to said first output terminal;

measuring whether a voltage is present at said first input terminal; and disabling said power-operated drive for said chamber lid when said measured voltage at said first input terminal is zero or below a predetermined voltage indicating an interruption in said first electric circuit and a fracture in one of said plurality of springs.

18. A method for detecting a spring fracture in a vacuum chamber machine of claim 17 further comprising the steps of:
connecting each end of each of said plurality of springs to one of a plurality of spring holders in an electrically insulated manner;

creating a second electric circuit between a second output terminal of said controller and a second input terminal of said controller by electrically connecting said plurality of spring holders in series using a second electrical line;

measuring whether all or a portion of said electrical voltage is present at said second input terminal;

determining whether there is a condition of defective insulation between one of said plurality of springs and one of a plurality of spring holders, said condition of defective insulation being present when all or said portion of said electrical voltage is measured at said second input terminal; and disabling said power-operated drive for said chamber lid when is said condition of defective insulation is determined.

* * * * *